United States Patent [19]

McClure

[11] Patent Number: 5,493,532
[45] Date of Patent: Feb. 20, 1996

[54] INTEGRATED CIRCUIT MEMORY WITH DISABLED EDGE TRANSITION PULSE GENERATION DURING SPECIAL TEST MODE

[75] Inventor: David C. McClure, Denton, Tex.

[73] Assignee: SGS-Thomson Microelectronics, Inc., Carrollton, Tex.

[21] Appl. No.: 251,337

[22] Filed: May 31, 1994

[51] Int. Cl.$^6$ ................................................ G11C 7/00
[52] U.S. Cl. ........................................ 365/201; 365/233.5
[58] Field of Search .............................. 365/201, 233.5, 365/195, 203, 202

[56] References Cited

U.S. PATENT DOCUMENTS 4,549,101 10/1985 Sood ............................................ 365/233
5,313,434 5/1994 Abe ............................................ 365/233.5

Primary Examiner—A. Zarabian
Attorney, Agent, or Firm—Rodney M. Anderson; Lisa K. Jorgenson; Richard K. Robinson

[57] ABSTRACT

An integrated memory circuit having special stress test mode capability, and that is safely controlled by edge transition detection, is disclosed. The memory includes a test mode enable circuit that generates a test mode enable signal responsive to receiving overvoltage signals or other codes at terminals of the memory; the test mode enable signal is presented to the edge transition detection circuitry, so that the edge transition detection pulse that would otherwise initiate a memory operation is not generated during special test mode. This prevents the disastrous possibility that memory functions would be initiated by false edge transition detection signals (such as may occur during ramping of supply voltages to stress levels) during the special test mode. Special tests, such as stress tests and long write cycle disturb tests, may thus be safely performed.

21 Claims, 3 Drawing Sheets

INTEGRATED CIRCUIT MEMORY WITH DISABLED EDGE TRANSITION PULSE GENERATION DURING SPECIAL TEST MODE

This invention is in the field of integrated circuits, and more specifically is in the field of controlling special test mode operation for integrated circuit memories.

BACKGROUND OF THE INVENTION

As is well known in the art, integrated circuit memories are generally tested to a large degree by operating the memory in its normal operating mode, in which each operating cycle writes data to or reads data from a single addressable location. Because of the high cost of modern automated test equipment, however, it is highly desirable to reduce the time required for testing each individual integrated circuit, to maximize throughput through and utilization of costly test equipment.

Many modern integrated circuits, particularly semiconductor memories, utilize special test modes in which elements within the memory may be tested or stressed in an efficient or improved manner relative to test patterns performed in normal operating mode. By way of background, it is known in the art to enable the selection of a special test mode, as opposed to a normal operating mode, by applying one or more so-called "overvoltage" signals (i.e., out of the specification range for normal operation) to one or more terminals of the integrated memory circuit, often in conjunction with a code to select one of several available test modes. Examples of techniques for entering special test mode are described in U.S. Pat. No. 5,072,138, issued Dec. 10, 1991, assigned to SGS-Thomson Microelectronics, Inc., and incorporated herein by this reference. Examples of such special test modes include "parallel" read and write operations, in which more memory cells than those associated with a single addressable location are accessed in a single memory cycle; such parallel reads and writes thus reduce the number of memory cycles required to exercise the entire memory. In addition, as described in my copending application Ser. No. 08/173,197, filed Dec. 22, 1993, assigned to SGS-Thomson Microelectronics, Inc. and incorporated herein by this reference, special tests may also be used to screen functional failures that would only be found in extremely long functional tests in normal operating mode, such as long cycle time reads or writes.

Another type of conventional special test operation stresses certain internal nodes of the memory with voltages beyond those encountered during normal operation. These special stress tests accelerate time and voltage dependent transistor failure mechanisms, (e.g., MOSFET gate dielectric failure). As a result, failure mechanisms that may only become apparent over time may be screened during manufacturing testing.

By way of further background, my copending U.S. application Ser. No. 08/172,854, filed Dec. 22, 1993, assigned to SGS-Thomson Microelectronics, Inc., and incorporated herein by this reference, describes certain stress tests, performable in a special test mode, for screening integrated memory circuits for latent reliability failures. As described in this copending U.S. application 08/172,854, a memory of the type having differential bit lines associated with each column of memory cells may be stressed, in a special test mode, by maintaining one of the bit lines of the pair at a high voltage (e.g., an elevated $V_{cc}$ voltage of on the order of 9 volts, where $V_{cc}$ in normal operation is nominally 5 volts), while maintaining the other bit line at ground. This stress test described in copending U.S. application Ser. No. 08/172,854, as well as other stress tests performed in a special test mode, is preferably performed by ramping the elevated power supply voltage to the stress level after the device has already been placed in the special test mode. This procedure is preferable, as large switching transients are avoided.

For all types of special stress tests, however, it is important to ensure that the high stress voltages applied internally to the integrated memory circuit in such a special stress test mode do not cause damage to the circuit that would otherwise not occur. This concern is also present, to some extent, for special test operations not involving the application of stress voltages, as the particular test conditions in a special test mode may be sufficiently different from normal operation as to present certain failure risks.

It is therefore an object of the present invention to provide a method and circuit for protecting integrated circuits from damage during special test modes, particularly those utilizing stress voltages.

It is a further object of the present invention to improve the reliability of integrated memory circuits by enabling the safe performance of stress tests therewithin.

It is a further object of the present invention to lock-out certain operating circuitry from affecting the operation of an integrated memory circuit while high stress voltages are applied thereto.

Other objects and advantages of the present invention will be apparent to those of ordinary skill in the art having reference to the following specification, together with the claims.

SUMMARY OF THE INVENTION

The invention may be implemented into an integrated memory circuit having special test modes, including a stress test mode in which extraordinary power supply voltages are used within the integrated circuit. The integrated memory circuit of the present invention includes a test mode entry circuit which generates a test mode enable signal; according to the present invention, this test mode enable signal gates the generation of memory cycle initiation pulses, such as an edge transition detection (ETD) pulse, which would otherwise initiate a memory cycle. As a result, false memory cycle initiation pulses are prevented from occurring during a special test, such as a stress test.

DETAILED DESCRIPTION OF THE PREFERRED EMBODIMENTS

Figure 1:
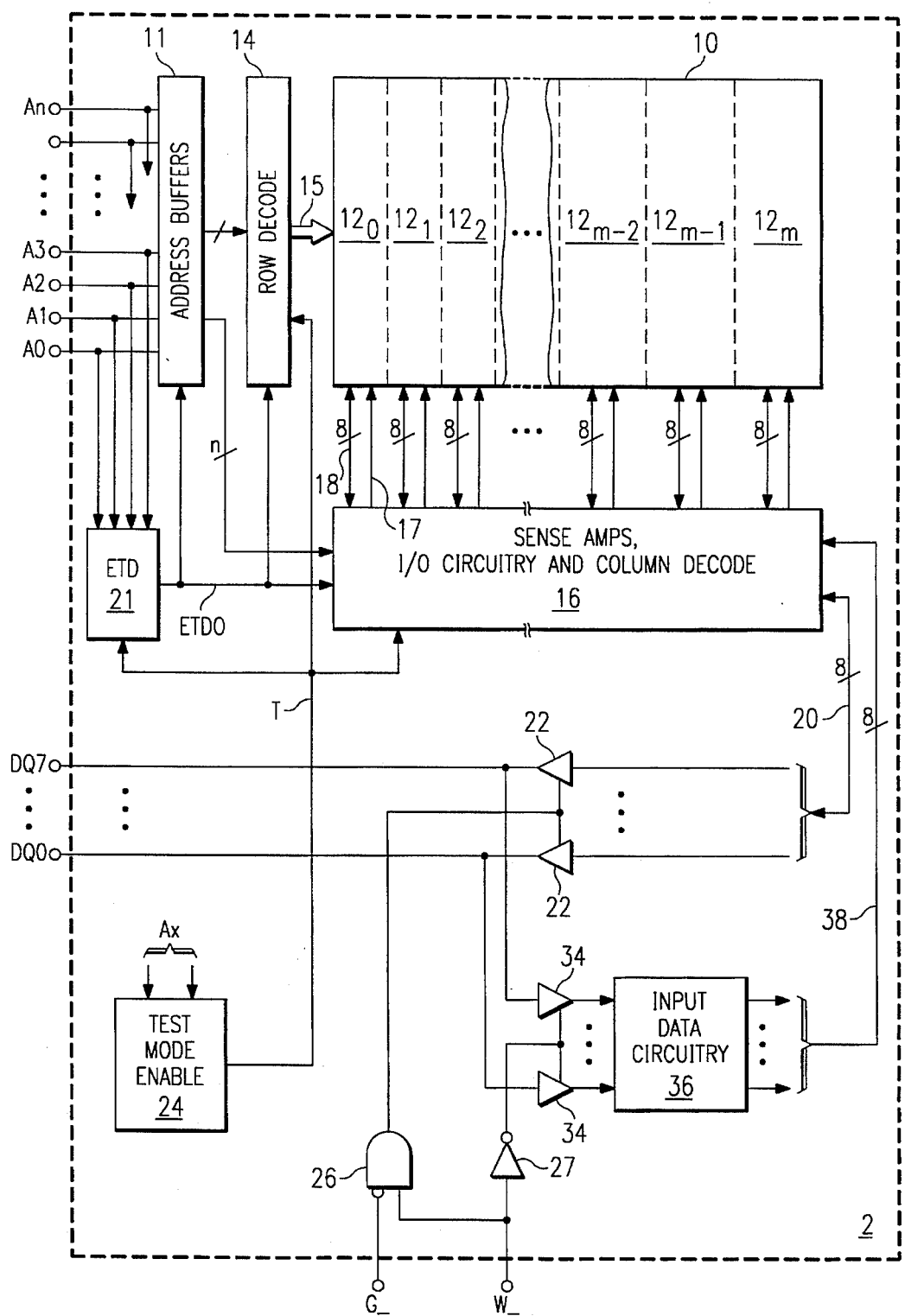
FIG. 1 is an electrical diagram, in block form, of an integrated circuit memory according to the preferred embodiment of the invention.

Referring first to FIG. 1, static random access memory (SRAM) 2 according to the preferred embodiment of the invention will now be described by way of example. The architecture of memory 2 shown in FIG. 1 is, of course, by way of example only, as the present invention may be useful in and readily applied to SRAMs of other various architectures (e.g., as described in U.S. Pat. No. 5,124,951, issued Jun. 23, 1992), in integrated memory circuits of many architectural types, such as ROMs, EPROMs, EEPROMs, FIFOs, DRAMs and the like, and also in memories embedded within large scale logic circuits such as microprocessors.

Memory 2 of FIG. 1 includes array 10 of memory cells arranged in rows and columns. In this example, as is common for modern memories, array 10 is subdivided into array blocks $12_o$ through $12_m$. Memory 2 receives address signals at its address terminals A0 through An, which are then buffered by address buffers 11. A row address portion of the buffered address signals is communicated to row decoder 14, which selects one of the rows in array 10 by way of word lines, or row lines, in bus 15. Similarly, a column address portion of the buffered address signals is communicated to column circuitry 16 (which, in this example, includes sense amplifiers, input/output circuitry, and column decode circuitry). Column circuitry 16 is operable to select the column or columns indicated by the buffered address signal, and to either present data signals from data input bus 20 to the selected cells, or to sense the contents of the selected cells (by way of sense amplifiers) and communicate the same to data output bus 38. A portion of the buffered address signals may also be used by column circuitry 16 to select only one of array blocks 12 in each cycle, to minimize active power dissipation by memory 2.

In the conventional manner, memory 2 has common input/output data terminals DQ0 through DQ7. Data terminals DQ are connected to input buffers 34, which in turn are connected to input data circuitry 36 for presenting input data signals received at terminals DQ to input data bus 38 during write cycles. Read operations are culminated by output buffers 22 presenting the contents of output data bus 38 to data terminals DQ0 through DQ7. Write enable terminal W_ receives a signal indicating selection of a read or write operation, and output enable terminal G_ receives a signal indicating whether (for a read operation) data terminals DQ of memory 2 are to be enabled. Write enable terminal W_ is coupled to the control terminals of input buffers 34 through inverter 27, and write enable terminal W_ and output enable terminal G_ are each coupled to inputs (inverting in the case of output enable terminal G_) of AND gate 26, which in turn has its output connected to the control terminals of output buffers 22. For a write operation, a low logic level at write enable terminal W_ enables input buffers 34 to present the signals received at data terminals DQ to input data circuitry 36, and disables output buffers 22. For a read operation, a high logic level at write enable terminal W_ in combination with a low logic level at output enable terminal G_, enables output buffers 22 to present the contents of output data bus 38 at data terminals DQ, and disables input buffers 34.

Memory 2, as well as many modern other SRAMs, are controlled to initiate a memory cycle by way of edge transition detection (ETD). According to this known technique, memory 2 is not fully static at all times, but rather utilizes internal dynamic logic to save operating power consumption. Referring to FIG. 1, memory 2 includes edge transition detection (ETD) circuitry 21, coupled to each of several input terminals (e.g., address terminals A0 through An, and data terminals DQ0 through DQ7) to detect logic transitions thereat. In response to a detected input logic level transition, ETD circuitry 21 generates a pulse on line ETDO that is communicated, either directly or by derivative signals therefrom, throughout memory 2 to initiate the memory cycle. As shown in FIG. 1, line ETDO is coupled to address buffers 11, row decoder 14, and column circuitry 16. Column circuitry 16 generates various control signals along control lines 17 into array 10 that are based upon the ETD pulse on line ETDO, as will be noted hereinbelow; column circuitry 16 also communicates data to and from each of array blocks 12 by way of buses 18, each of which are eight bits wide in this example.

Memory 2 according to this embodiment of the invention also includes the ability to enter special test modes, in which both the internal operation of memory 2 and also the functions of external terminals of memory 2 are different from that during normal operation as a memory. As shown in FIG. 1, test mode enable circuitry 24 is provided which receives inputs from certain terminals of memory 2 that are useful in normal operation, for example one or more address terminals (shown in FIG. 1 as $A_x$). An example of test mode enable circuitry 24 is described in the above-reference U.S. Pat. No. 5,072,138; of course, other conventional implementations for test mode enable circuitry 24, and techniques of operating the same, may alternatively be used. Alternatively or additionally, test mode enable circuitry 24 may receive an external test mode enable signal to enter test mode; use of such an external terminal is generally limited to electrical testing of memory 2 in wafer form, as the number of terminals in wafer form is not as critical as for packaged devices. In response to these inputs, test mode enable circuitry 24 produces a test mode enable signal on line T, which is communicated throughout memory 2 to select and control the desired special test mode, for example to row decode 14 and column circuitry 16 as shown in FIG. 1. In addition, according to this embodiment of the invention, line T is also coupled to ETD circuit 21 to control the generation of the ETD signal on line ETDO during test mode, as will be described in further detail hereinbelow.

Of course, other timing and control circuitry (not shown) will also be present within memory 2 to ensure the proper timing of its operations. In addition, other functional external signals, such as chip enable or clock signals, may also be received at terminals of memory 2 for control of its operation. It is therefore contemplated that the above-referenced general description of memory 2 will be suitable for explanation to one of ordinary skill in the art of the construction, operation and benefits of the present invention as described herein.

Figure 2:
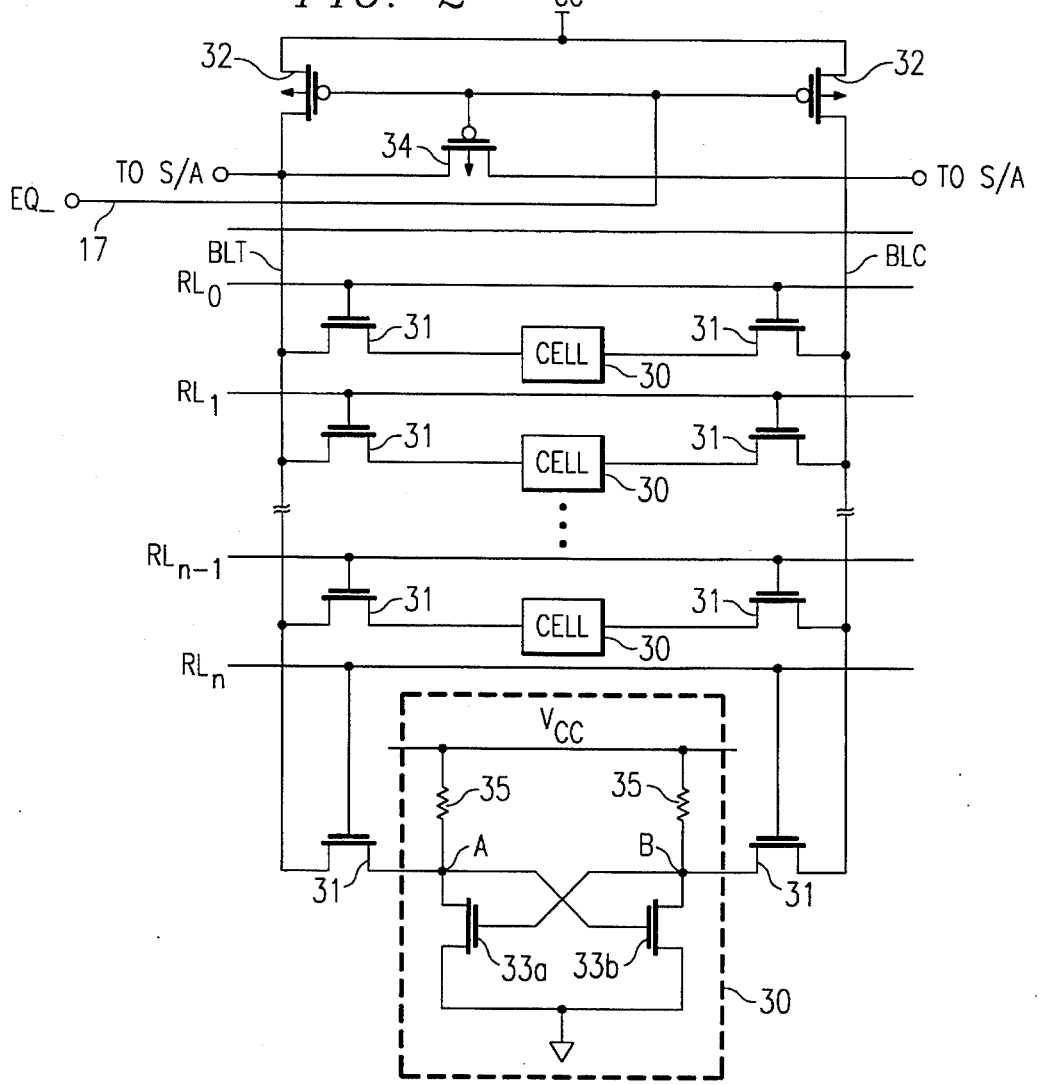
FIG. 2 is an electrical diagram, in schematic form, of a column of memory cells in the integrated circuit memory according to the preferred embodiment of the invention.

FIG. 2 illustrates a column of memory cells in memory 2. In this example, each memory cell 30 is of the four-transistor two-resistor type, where transistors 33a, 33b are cross-coupled with one another at nodes A and B, and with resistors 35 serving as loads to the cross-coupled transistors. As shown in FIG. 2, cells 30 in the exemplary column are each connectable by pass transistors 31 to complementary bit lines BLT, BLC, which in turn are forwarded to a sense amplifier in column circuitry 16 in the conventional manner. The gates of the pair of pass transistors 31 associated with one of cells 30 in the column are controlled by a word line, or row line, RL; in the example of FIG. 2, each column contains n cells 30, each associated with a row controlled by one of row lines $RL_0$ through $RL_n$. In this exemplary column, bit lines BLT, BLC are precharged to $V_{cc}$ through p-channel transistors 32, and equilibrated to one another via p-channel transistor 34, under the control of equilibration timing signal EQ_ on line 17 which, when energized (active low), turns on both transistors 34 and transistor 32. Such precharge and equilibration is accomplished during such time as bit lines BLT, BLC are not being driven by write circuitry or by any of cells 30 (all row lines RL being off at this time). As noted above, equilibration timing signal EQ_ is generated by column circuitry 16 responsive to a pulse on line ETDO from ETD circuit 21, to turn on transistors 32, 34 for a brief period at the beginning of each memory cycle, thus precharging and equilibrating bit lines BLT, BLC.

Alternatively, other column architectures may also be used in accordance with the present invention. For example, as described in the above-referenced copending U.S. application No. 08/172,854, bit line load transistors (typically p-channel devices) may be provided to pull up the bit lines toward the power supply voltage in normal operation; similarly as described above, an equilibration transistor is provided in this architecture as well, to equilibrate the bit lines in each pair at the beginning of a memory cycle under the control of an equilibration signal derived from an ETD event. In the example described in copending U.S. application No. 08/172,854, the gates of the bit line load transistors are controlled so as to be turned off during certain special test modes such as the stress tests described therein.

According to one of the stress tests described in the above-referenced copending U.S. application No. 08/172,854, a high stress voltage (e.g., on the order of 9 volts) is placed on one of bit lines BLT, BLC with the other bit line at ground, while the row line(s) RL are turned on. For example, if true bit line BLT is held to a high voltage with complement bit line BLC held low and both pass transistors 31 turned on, in the column of FIG. 2, transistor 33b will be stressed by the high voltage on true bit line BLT (and thus at node A) applied to its gate, while transistor 33a will be stressed by the high source-drain voltage between its drain, at node A, and its source at ground. Preferably, the stress test is performed twice, once with the stress voltage on true bit line BLT and the other with the stress voltage on complement bit line BLC.

Figure 3:
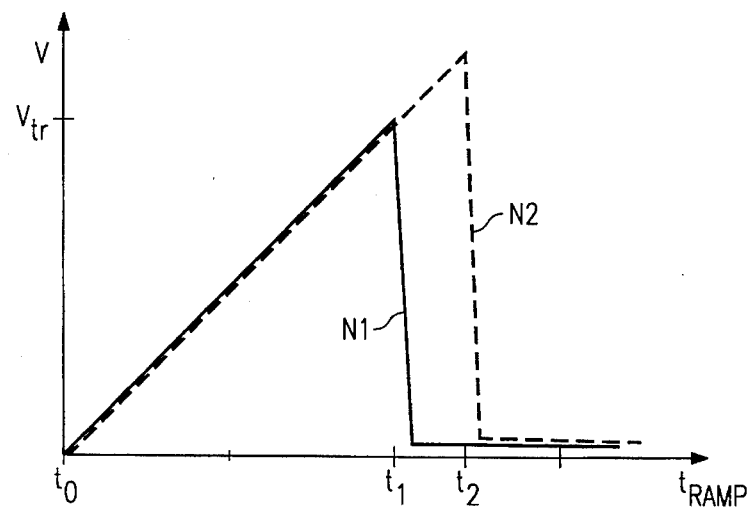
FIG. 3 is a plot of voltage over time for a pair of internal nodes within the integrated circuit memory, during the ramping of stress voltages thereto.

In order to keep transient currents reasonable for certain special test modes, memory 2 is preferably powered up in test mode, rather than switching into test mode after power-up, considering that the entire circuit (e.g., multiple rows and multiple array blocks) may be energized in the desired special test mode. It has been discovered that, during the powering up of memory 2 in such a special test mode, various nodes within the integrated circuit may respond at different times to the power supply voltages. Even if all of the stress voltage input terminals and power supply terminals are ramped simultaneously with one another, it has been discovered that different internal circuit nodes will resolve themselves into the desired logic state at different times, and at different ramp voltages, because of differences in the trip points of gates within the circuit, differences in the number of series devices in a stack within a gate, differences in capacitive loads at different nodes, and other similar factors. Of course, if the ramping of voltages occur at different times for different terminals, the time at which internal nodes resolve themselves may be further widened; in addition, it has been observed that faster ramp rates will widen this resolution time differential. FIG. 3 illustrates the time-voltage characteristic of two internal nodes N1, N2 in an SRAM memory, in response to increasing time ($t_{ramp}$) over which the stress voltages are ramped. As evident FIG. 3, node N1 resolves itself to a low logic level upon reaching voltage $V_{tr1}$ at time $t_1$, while node N2 does not resolve to the low logic level until it has reached voltage $V_{tr2}$, at time $t_2$. It has been observed that these different resolution times (e.g., $t_1$, $t_2$) can result in the edge transition detection circuitry falsely generating an ETD pulse, responsive to which the memory will initiate memory cycle operations.

Referring back to FIG. 2, it has been observed that the turning on of equilibration transistor 34 at such time as a high differential voltage is present across bit lines BLT, BLC, particularly at extraordinary stress levels, could result in significant current draw therethrough, at levels that could cause failure of transistor 34 or other elements in the circuit. As noted above, equilibration signal EQ_ is generated responsive to a pulse on line ETDO from ETD circuit 21 upon its detection of a transition at an input. Also, as noted above, it has been observed that a false ETD event may occur due to the time difference of which certain internal nodes are resolved during the ramping of voltages in power-up as shown in FIG. 3. If this false ETD event were to cause the equilibration signal EQ_ on line 17 to turn on transistor 34 while a differential voltage is being driven across bit lines BLT, BLC, catastrophic failure of memory 2 could result. Of course, other factors such as system or device noise, glitches at the input terminals of memory 2, and incorrect test procedures, may also cause a false or undesired ETD event.

Furthermore, since many special tests, including stress tests, may be performed for many columns (up to on the order of 4096 or greater columns) at once, the generation of an ETD pulse while bit lines are being actively driven with a differential voltage may be especially devastating.

Figure 4:
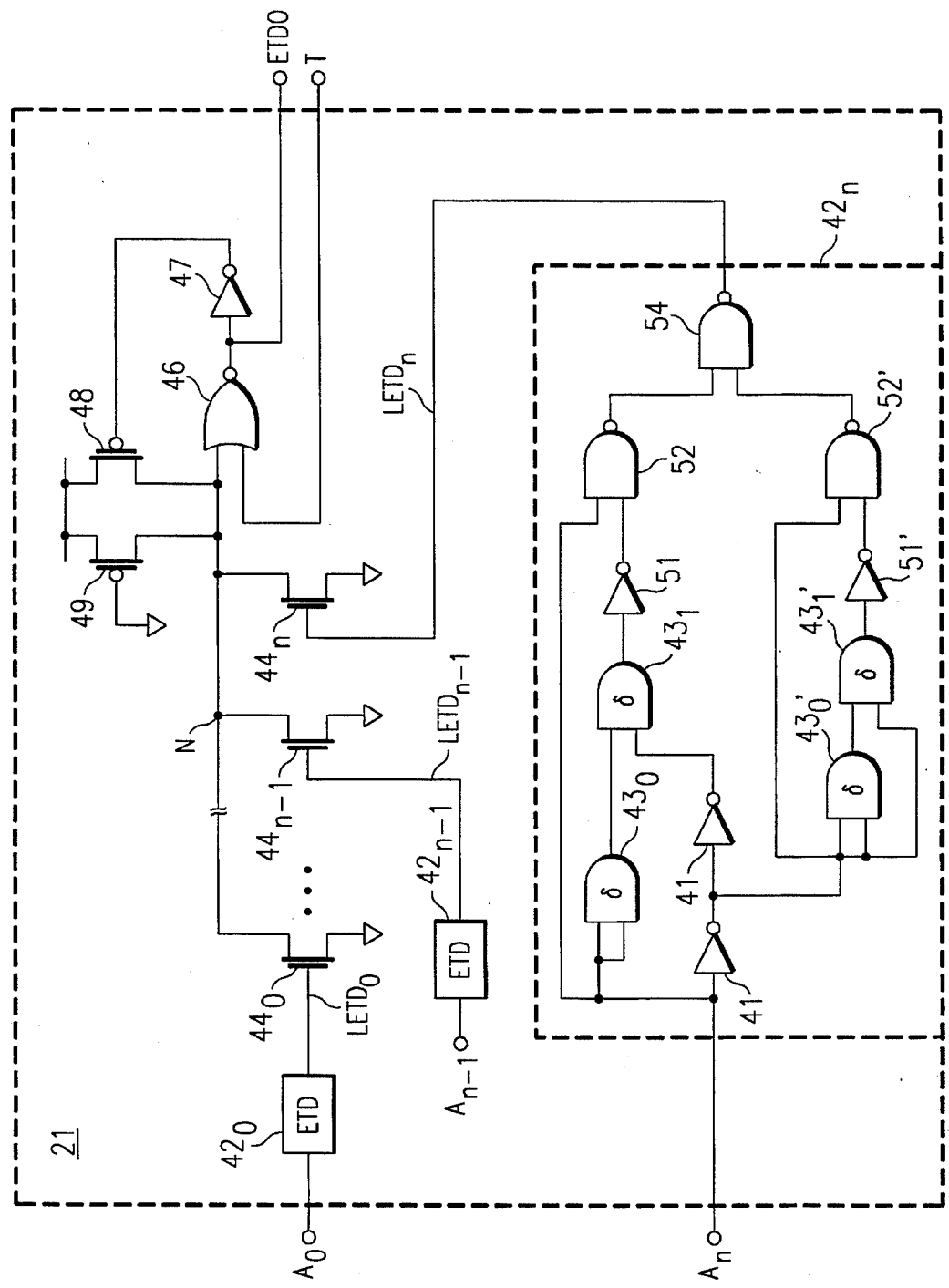
FIG. 4 is an electrical diagram, in schematic form, of an edge transition detection circuit according to the preferred embodiment of the invention.

According to the preferred embodiment of the invention, therefore, line T from test mode enable circuit 24 is also coupled to ETD circuit 21, so that the generation of a pulse on line ETDO is inhibited during such time as memory 2 is in a special test mode. Referring now to FIG. 4, the construction and operation of ETD circuit 21 according to the preferred embodiment of the invention will now be described.

As shown in FIG. 4, each input terminal (address terminals A in this example, although data terminals DQ or control terminals such as write enable W_ or chip enable may also be applied to ETD circuit 21) is received by a local ETD circuit 42. Each local ETD circuit 42 is preferably located near its associated input terminal, and generates a pulse at its output responsive to detection of a transition thereat. One of local ETD circuits $42_n$ is shown in detail in FIG. 4, by way of example.

In this example, local ETD circuit $42_n$ includes two legs, one leg for generating a pulse responsive to a high-to-low transition at associated input terminal $A_n$, and the other leg for generating such a pulse responsive to a low-to-high transition thereat. The top leg of local ETD circuit $42_n$ includes a first delay stage $43_0$, consisting of a delaying AND function, which has both of its input coupled to input terminal $A_n$. The output of first delay stage 43 is connected to one input of second delay stage $43_1$, which has its input connected to input terminal $A_n$ via two inverters 41. The output of second delay stage $43_1$, after inversion by inverter 51, is presented to a first input of NAND gate 52 which receives input terminal $A_n$ at its other input; the output of NAND gate 52 is presented to an input of NAND gate 54, which drives local ETD pulse line $LETD_n$ at its output. The top leg of local ETD circuit $42_n$ thus produces a low level pulse at the output of NAND gate 52, and thus a high level pulse at the output of NAND gate 54 on line $LETD_n$ responsive to a low-to-high transition at input terminal $A_n$, for a duration corresponding to the sum of the delays of delay stages $43_0$, $43_1$. The bottom leg of local ETD circuit $42_n$ is similarly constructed, but instead receives the inverted state of input terminal $A_n$ (via one of inverters 41), and as such generates a high logic pulse on line $LETD_n$ responsive to a high-to-low transition at input terminal $A_n$, also for a duration corresponding to the sum of the delays of delay stages $43_0'$, $43_1'$.

Each line LETD from a local ETD circuit 42 is connected to the gate of a corresponding n-channel transistor 44 in ETD circuit 21. Each transistor 44 has its source biased to ground, and its drain connected in common with the drains of the other transistors 44, at a node N. Node N is pulled up to $V_{cc}$ by keeper p-channel transistor 49, which has its drain connected to node N, its source to $V_{cc}$, and its gate biased to ground; keeper transistor 49 is preferably weak enough that it is easily overdriven by any one of transistors 44 being turned on.

Node N is connected to a first input of NOR gate 46 which, according to this embodiment of the invention, receives test mode enable signal T at its other input. The output of NOR gate 46 drives line ETDO in memory 2 of FIG. 1. Inverter 47 receives line ETDO at its input, and has its output connected to the gate of p-channel pull-up transistor 48, which has its source connected to $V_{cc}$ and its drain connected to node N. This construction assumes positive logic (i.e., high logic level active) on line ETDO; of course, if a negative-going pulse is desired as the ETD pulse, the output of ETD circuit 21 may alternatively be taken from the output of inverter 47.

While local ETD circuits 42 are preferably located near their respective input terminal, it is contemplated that transistors 44, 48, 49, and also NOR gate 46 and inverter 47, are preferably located near one another at a centralized location of memory 2, for performance reasons. In addition, other features may also be added to ETD circuit 21, specifically the provision of a delay circuit that has a duration that is substantially longer than that generated by the local ETD circuits 42, as described in my copending U.S. application Ser. No. 08/220,834, filed Mar. 31, 1994, entitled "Integrated Circuit with Centralized Control of Edge Transition Detection Pulse Generation", assigned to SGS-Thomson Microelectronics, Inc., and incorporated herein by this reference. Furthermore, it is of course contemplated that multiple ETD circuits 21 may be provided at different locations of the integrated memory circuit 2, particularly if the chip size is quite large.

In normal operating mode, assuming the steady-state condition where no input transition has recently occurred, each of lines LETD are low because, in the example illustrated in FIG. 4, the output of NAND gate 54 in each of local ETD circuits 42 will be low. With each of lines LETD low, all of transistors 44 are turned off, allowing transistor 49 to keep node N at a high voltage, at or near $V_{cc}$. Since memory 2 is in normal operating mode, line T is at a low logic level, allowing the high logic level of node N to force line ETDO at the output of NOR gate 46 low. This low logic level on line ETDO indicates that no input transition has recently been detected. The output of inverter 47 is high in this state, turning off transistor 48.

Upon one of the inputs to local ETD circuits 42 making a logic transition in normal operating mode (line T low), the corresponding one of local ETD circuits 42 will produce a high logic level pulse on its line LETD (of a duration set by the delay within local ETD circuit 42, as noted above), turning on its associated transistor 44 during the pulse. Since even one of transistors 44 has sufficient drive to overdrive transistor 49, node N is pulled low during the local ETD pulse, in turn generating a high logic level pulse at the output of NOR gate 46 on line ETDO. This pulse on line ETDO, as discussed above, initiates a memory cycle, and is used to generate internal timing signals throughout memory 2 (e.g., equilibration signal EQ_). The high logic level pulse is communicated, via inverter 47, to the gate of transistor 48 so as to turn transistor 48 on; as a result, once the local ETD pulse on all of lines LETD terminates, the combination of transistors 48, 49 will rapidly pull node N back high until line ETDO returns low again. Upon line ETDO returning low, transistor 48 turns off and node N is maintained high by keeper transistor 49.

According to this embodiment of the invention, however, entry into a special test mode locks out the operation of ETD circuit 21. As discussed above, line T is driven high by test mode enable circuit 24 upon and during the enabling of a special test mode, such as the stress test modes discussed above. With line T at a high logic level, the output of NOR gate 46 is unconditionally set low, regardless of the state of node N and thus regardless of the detection of input transitions by local ETD circuits 42. As such, the generation of ETD pulses on line ETDO is inhibited during the selection and performance of special test modes in memory 2.

As a result, the internal instability of memory 2 during the ramping of power supply voltages as utilized during special stress tests, as discussed above, will not cause a false ETD signal from being generated. Accordingly, functions such as equilibration of bit lines will not inadvertently occur, especially during such special tests as those which drive a differential voltage across bit lines BLT, BLC of FIG. 2. The present invention thus reduces the possibility of damage to integrated memory circuit 2 during the performance of special tests, including stress tests and write disturb tests.

Alternative implementations of the present invention will, of course, be apparent to those of ordinary skill in the art having reference to this specification. For example, the test mode enable signal (shown on line T of FIG. 4) may be decoded so that the ETD circuit is disabled only during certain ones of the available special tests; as such, the ETD functionality of the memory may be enabled during special tests such as parallel write and parallel read functions, but disabled during stress tests and write disturb tests.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. An integrated memory circuit, having a normal operating mode and a special test mode, comprising:

a plurality of memory cells, arranged in rows and columns;

a plurality of input terminals;

circuitry for selecting one of said plurality of memory cells responsive to an address signal received at said plurality of input terminals;

edge transition detection circuitry, coupled to said plurality of input terminals, for initiating a memory operation responsive to detecting a logic transition at said plurality of input terminals;

test mode enable circuitry for generating a test mode enable signal responsive to receiving a test mode select signal; and a gating circuit, coupled to said test mode enable circuitry and to the edge transition detection circuitry, for inhibiting said edge transition detection circuitry from initiating the memory operation responsive to said test mode enable signal.

2. The circuit of claim 1, wherein said plurality of input terminals comprise:

a plurality of address terminals, for receiving the address signal;

a plurality of data terminals; and a control terminal.

3. The circuit of claim 2, wherein said edge transition detection circuitry is coupled to said plurality of address terminals, and initiates the memory operation responsive to detecting a logic transition at one or more of said plurality of address terminals.

4. An integrated memory circuit, having a normal operating mode and a special test mode, comprising:

a plurality of memory cells, arranged in rows and columns;

a plurality of address terminals, for receiving an address signal;

a plurality of data terminals;

a control terminal;

circuitry for selecting one of said plurality of memory cells responsive to the address signal received at said plurality of address terminals;

edge transition detection circuitry, coupled to said plurality of address terminals and to said plurality of data terminals, for initiating a memory operation responsive to detecting a logic transition at one or more of said plurality of address terminals or data terminals; and test mode enable circuitry for generating a test mode enable signal responsive to receiving a test mode select signal;

wherein said edge transition detection circuitry is coupled to said test mode enable circuitry to receive the test mode enable signal, so that said edge transition detection circuitry is inhibited from initiating the memory operation responsive to said test mode enable signal.

5. The circuit of claim 3, wherein said edge transition detection circuitry is also coupled to said control terminal, and initiates a memory operation responsive to detecting a logic transition at one or more of said plurality of address terminals or at said control terminal.

6. The circuit of claim 1, wherein each column of memory cells is associated with a pair of bit lines;

and wherein, during the special test mode, a differential voltage is placed across at least one of the pair of bit lines;

and further comprising:

an equilibration transistor, having a conduction path connected between the bit lines in each pair of bit lines, and having a control terminal controlled in such a manner as to turn on the equilibration transistor responsive to initiation of a memory operation by said edge transition detection circuitry.

7. The circuit of claim 6, wherein said special test mode corresponds to a stress test;

and further comprising:

a power supply terminal, for receiving a power supply voltage near a first voltage in the normal operating mode, and for receiving a power supply voltage near a second, higher, voltage for the stress test.

8. The circuit of claim 1, wherein the test mode select signal comprises an overvoltage signal at one of said plurality of input terminals.

9. The circuit of claim 8, wherein the memory has a plurality of special test modes;

and wherein one of the plurality of special test modes is selected responsive to a code received in conjunction with the overvoltage signal.

10. A method of operating an integrated circuit that includes a memory having a normal operating mode and a special test mode, comprising the steps of:

monitoring a plurality of input terminals to detect a logic level transition thereat;

responsive to detecting a logic level transition at one of the plurality of input terminals, initiating a memory operation;

receiving a test mode select signal;

responsive to receiving the test mode select signal, initiating the special test mode for the memory; and responsive to receiving the test mode select signal, inhibiting the initiation of the memory operation responsive to detecting the logic level transition at one of the plurality of input terminals.

11. The method of claim 10, wherein said step of initiating a memory operation comprises generating an edge transition detection signal with a logic function responsive to detecting a logic level transition at one of the plurality of input terminals;

wherein said step of initiating the special test mode comprises generating a test mode enable signal responsive to receiving the test mode enable signal;

and wherein said inhibiting step comprises applying the test mode enable signal to the logic function so as to inhibit the logic function from generating the edge transition detection signal.

12. The method of claim 10, wherein the plurality of input terminals monitored in the monitoring step comprise address terminals.

13. A method of operating an integrated circuit that includes a memory having a normal operating mode and a special test mode, comprising the steps of:

monitoring a plurality of address terminals and data terminals to detect a logic level transition thereat;

responsive to detecting a logic level transition at one of the plurality of address terminals or data terminals, initiating a memory operation;

receiving a test mode select signal;

responsive to receiving the test mode select signal, initiating the special test mode for the memory; and responsive to receiving the test mode select signal, inhibiting the initiation of the memory operation responsive to detecting a logic level transition at one of the plurality of address and data terminals.

14. The method of claim 10, wherein the memory comprises a plurality of memory cells arranged in rows and columns, each column of memory cells associated with one of a plurality of pairs of differential bit lines;

and wherein said step of initiating a memory operation comprises precharging each of the differential bit lines to a power supply voltage.

15. The method of claim 10, wherein the memory comprises a plurality of memory cells arranged in rows and columns, each column of memory cells associated with one of a plurality of pairs of differential bit lines;

and wherein said step of initiating the memory operation comprises equilibrating each of the pairs of differential bit lines.

16. The method of claim 15, wherein said step of initiating the special test mode comprises driving a differential voltage across at least one of the pairs of differential bit lines.

17. The method of claim 16, wherein said step of initiating the special test mode comprises driving a differential voltage across all of the pairs of differential bit lines.

18. The method of claim 10, further comprising:

receiving a power supply at a power supply terminal at a first voltage during the normal operating mode, and at a second, elevated, voltage during the special test mode.

19. The method of claim 18, wherein the memory comprises a plurality of memory cells arranged in rows and columns, each column of memory cells associated with one of a plurality of pairs of differential bit lines;

wherein said step of initiating the memory operation comprises equilibrating each of the pairs of differential bit lines;

and wherein said step of initiating the special test mode comprises driving a differential voltage across at least one of the pairs of differential bit lines.

20. The method of claim 10, further comprising:

powering up the memory during said step of initiating the special test mode.

21. The circuit of claim 3, wherein said edge transition detection circuitry is also coupled to said plurality of data terminals, and initiates the memory operation responsive to detecting a logic transition at one or more of said plurality of address terminals or at one or more of said data terminals.

* * * * *